United States Patent [19]
Stone et al.

[11] Patent Number: 5,266,952
[45] Date of Patent: Nov. 30, 1993

[54] FEED FORWARD PREDICTIVE ANALOG-TO-DIGITAL CONVERTER

[75] Inventors: Wade J. Stone, Topanga; Howard S. Nussbaum, Los Angeles; Kikuo Ichiroku, Santa Monica; Benjamin Felder, Saugus; William P. Posey, Playa Del Rey, all of Calif.

[73] Assignee: Hughes Aircraft Company, Los Angeles, Calif.

[21] Appl. No.: 860,528

[22] Filed: Mar. 30, 1992

[51] Int. Cl.$^5$ .................. H03M 1/12; H03M 3/04
[52] U.S. Cl. ................................ 341/156; 341/143
[58] Field of Search ............ 341/156, 155, 118, 143; 375/27, 28

[56] References Cited

U.S. PATENT DOCUMENTS

| | | | |
|---|---|---|---|
| 4,536,880 | 8/1985 | Grallert | 341/143 X |
| 4,792,787 | 9/1984 | Speiser et al. | 341/156 |
| 4,849,758 | 7/1989 | Rosebrock | 341/143 |
| 4,849,759 | 7/1989 | Hughes | 341/156 |

OTHER PUBLICATIONS

Grebene, "Bipolar and MOS Analog Integrated Circuit Design", John Wiley & Sons, chapter 15, pp. 825–879 (1984).
Harris, "A Wide Dynamic Range A-toD- Converter Using a Band Limited Predictor-Corrector DPCM Algorithm", IEEE Int'l Conf. Jun. 8-10, 1987.
McKnight et al., "Developments in the Techniques for Enhancing the Dynamic Range of Analog to Digital Converts", Proc. ICASSP, 1988.

*Primary Examiner*—Sharon D. Logan
*Attorney, Agent, or Firm*—Terje Gudmestad; Jeannette M. Walder; W. K. Denson-Low

[57] ABSTRACT

A linear predictive ADC employs a fully feed forward design to extend its dynamic range, allow greater speed of operation, achieve stable operation and eliminate a requirement for sample-and-hold circuits. A first quantizer (Qc) converts an input analog signal to a digital format, while a signal predictor (32) predicts a subsequent value of the input signal. After conversion back to analog format, the predicted signal is compared with the actual subsequent value of the input signal to produce an error signal that is converted to a digital format by a second quantizer (Qf). The digital predicted signal is fed forward and combined with the digital error signal to produce a high precision digital output. The analog error signal is preferably amplified prior to digitation to take advantage of the full bit capacity of the second quanitzer (Qf), and then digitally de-amplified back to its original scale. Digital gain and offset adjustment mechanisms (44, 50) are preferably provided to compensate for amplification/de-amplification mismatches and system offsets. The quantizers (Qc, Qf), predictor (32) and a digital register (36) that interfaces between the predictor and the output combiner (46) are clocked in a set sequence to ensure that the predicted signal from the register (36) corresponds in time to the error signal presented to the output combiner (46).

26 Claims, 2 Drawing Sheets

FEED FORWARD PREDICTIVE ANALOG-TO-DIGITAL CONVERTER

This invention was made with Government support. The Government has certain rights in this invention.

BACKGROUND OF THE INVENTION

1. Field of the Invention

This invention relates to analog-to-digital converters (ADCs), and more particularly to ADCs that incorporate a predictive function by which a predicted input signal value is compared with the actual input signal to generate an error signal, and the error signal is combined with the predicted value to produce an output.

2. Description of the Related Art

ADCs convert analog quantities such as a voltage or a current into digital words. Numerous different types of ADC designs have been implemented; a general treatment of the subject is provided in Grebene, *Bipolar and MOS Analog Integrated Circuit Design*, John Wiley & Sons, chapter 15, pages 825–879 (1984). The two most pertinent designs for purposes of the present invention are a multi-pass subranging converter using one or a pair of sample-and-hold circuits, and the differential pulse code modulation (DPCM) linear predictive coder.

A multi-pass ADC using a sample-and-hold circuit is described in Harris, "A Wide Dynamic Range A-to-D Converter Using a Band Limited Predictor-Corrector DPCM Algorithm", *IEEE Int'l Conf. on Comm.*, Jun. 8–10, 1987, and a similar circuit is illustrated in FIG. 1 herein. An input analog signal is fed into a sample-and-hold circuit 2 that obtains periodic analog samples of the input signal. Each sample is provided to a quantizer Q1 that provides a course digitized version of the sample to both a digital-to-analog converter (DAC) 4 and an output summing junction 6. The DAC 4 converts the sample back to analog format and delivers it to another summing junction 8.

The input signal sample from sample-and-hold circuit is also transmitted to the summing junction 8, preferably via a second sample-and-hold circuit 10. This second sample-and-hold allows the system to be speeded up with the use of a biphase clock for both sample-and-holds, but in general is not essential. The DAC output is subtracted from the sampled input circuit at summing junction 8 to yield a signal that represents the combined conversion errors of quantizer Q1 and DAC 4 (the DAC is generally assumed to have a zero error). This error signal is then expanded by a factor of A in an amplifier A1 to bring it up to the full scale of a second quantizer Q2, which is typically about 1–2 volts peak-to-peak. After quantization by Q2, the amplified digital error signal is scaled down by a factor of A in a digital divider 12 to yield a true-scale digital error signal. The output summing junction 6 combines the coarsely digitized input sample from Q1 with the signal from digital divider A that represents the error associated with the course signal from Q1, so that the resultant output digital signal on output line 14 is a more accurate representation of the input analog signal and would be obtained by simply quantizing the input.

While the circuit of FIG. 1 provides good conversion accuracy, it requires an extreme linearity in the sample-and-hold circuits and in the DAC, and an intricate timing sequence to ensure that the input signals to the summing junction 6 and 8 represent the same sample. The switching nature of the sample-and-hold circuits also places a severe restriction upon the input signal's amplitude and frequency, which is necessary to avoid the introduction of unacceptable distortion components. Video band two-pass ADCs of this design typically require two sample-and-hold circuits.

A feedback DPCM ADC that utilizes a predictor function to provide extended dynamic range to a conventional ADC is illustrated in FIG. 2. The circuit can conveniently be described beginning at the output line 16, which carries the circuit's digital output signal. The output signal is updated periodically at the ADC function's sampling frequency, and each output is also fed into a predictor circuit 18 that predicts the value of the next periodic input signal based upon the values of the most recent output signal samples. The predicted signal value, in digital format, is supplied to an output summing junction 20 and also to a DAC 22. The output of the DAC, which represents the predicted value of the next signal in analog format, is compared with the actual input analog signal in a summing junction 24, with the predicted value subtracted from the actual value to yield an analog error signal. The error signal is amplified by a factor A to bring the error within the fullscale range of Q3 in amplifier A2, converted to digital format in quantizer Q3, and scaled back down by a factor of A in a digital divider 26 to compensate for the amplification of A2. The resulting digital error signal at the output of divider 26 is combined with the digital predicted signal from predictor 18 in the output summing junction 20 to produce the final converter output.

While the circuit of FIG. 2 avoids the use of sample-and-hold circuits with their attendant dynamic range limitations, and also uses only a single quantizer as opposed to the two quantizers in the circuit of FIG. 1, it does have significant disadvantages. If the input is overdriven with respect to the full scale capability of the DAC, a large error is produced in the DAC output. This error includes high frequency components that are beyond the designed input bandwidths of the predictor. Outside these bandwidths large amplification takes place and builds up in a positive feedback loop, eventually resulting in an output oscillation between the positive and negative voltage supply bus levels. A similar instability can result from high frequency signals that enter the circuit from other sources, such as extreme quantizing errors and noise spikes. In addition to a capability for detecting an unstable operating condition, the system must have a reset capability once the instability has been detected. The time required for reset may be beyond the permissible limits of the overall system into which the ADC is connected, such as certain radar systems.

ADCs that incorporate both a predictor circuit and a sample-and-hold function are disclosed in U.S. Pat. No. 4,792,787 to Speiser et al., in the Harris article mentioned above, and in McKnight et al., "Developments in the Techniques for Enhancing the Dynamic Range of Analog to Digital Converters", *PROC. ICASSP*, 1988. These circuits perform a sample-and-hold on an analog error signal, rather than on the input analog signal directly, and thereby avoid much of the dynamic range limitations associated with FIG. 1. However, they can still become unstable if the input is overdriven or slews too fast.

SUMMARY OF THE INVENTION

The present invention seeks to provide an ADC with an extremely high dynamic range of 16 bits or more, making it realizable in the video band, that also avoids the use of sample-and-hole circuits and their attendant very high linearity requirements, and uses a fully feed forward architecture that avoids the destabilization problems of prior ADCs that incorporate predictor circuits.

To accomplish these goals, a feed forward ADC is provided with circuitry for producing both digital and analog prediction signals that represent a predicted subsequent value of an input analog signal. A digital error signal is derived that represents the difference between the value of the analog prediction signal and the actual subsequent value of the input analog signal. The digital prediction signal is fed forward and combined with the digital error signal to yield a digital output signal that closely corresponds to the analog input signal. No sample-and-hold circuits are employed, and the feed forward nature of the circuit prevents any feedback-related instability. The feed forward operation also allows for higher speed data conversion than feedback systems by pipelining functions.

In a preferred embodiment the digital and analog prediction signals are produced by a first quantizer that is connected to periodically quantize the input analog signal, a predictor circuit that produces the digital prediction signal from the quantizer output, and a DAC that produces the analog prediction signal from the digital prediction signal. An analog error signal representing the difference between the actual and the predicted subsequent values of the input signal is first obtained, and a second quantizer converts the signal to the desired digital error signal. The timing of the first and second quantizers and of the prediction operations are synchronized so that the correct signals are compared with each other to obtain the error signal, and the quantized error signal is combined with the correct digital prediction signal. A digital signal storage means is also interfaced between the predictor and the output signal combiner to store the digital predicted signal and present it to the combiner at the appropriate time.

As with prior circuits, the analog error signal is amplified prior to quantization to take advantage of the quantizer's full range, and then de-amplified after quantization. In accordance with the invention, the de-amplified output is adjusted to compensate for mismatches between the amplifying and de-amplifying mechanisms, and an offset adjustment is also furnished to the output signal combiner to compensate for offsets in the quantized error signal.

The resulting ADC can have extremely high dynamic range, in excess of 16 bits, and avoids the above problems associated with the prior circuits. Further features and advantages of the invention will be apparent to those skilled in the art from the following detailed description, taken together with the accompanying drawings.

DETAILED DESCRIPTION OF THE INVENTION

Figure 1:
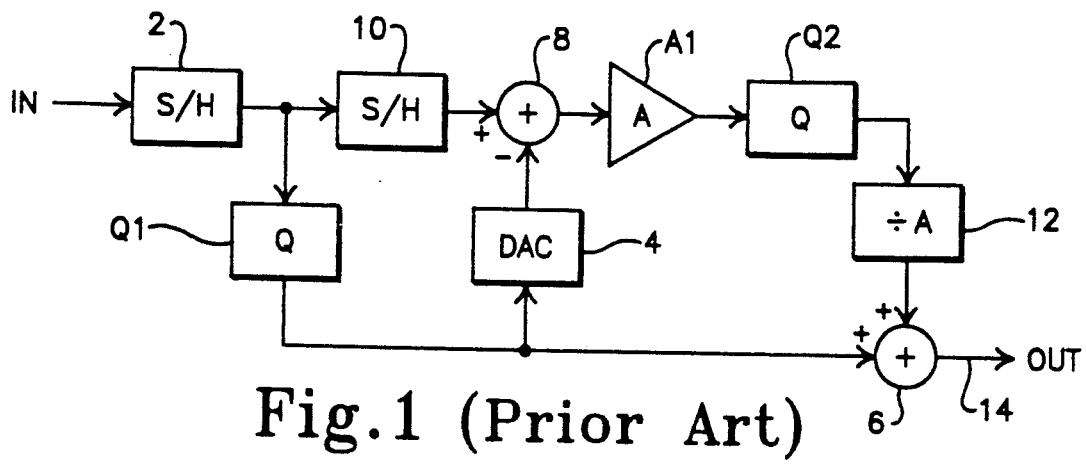
FIGS. 1 and 2 are block diagrams of respective prior ADC circuits.
Figure 2:
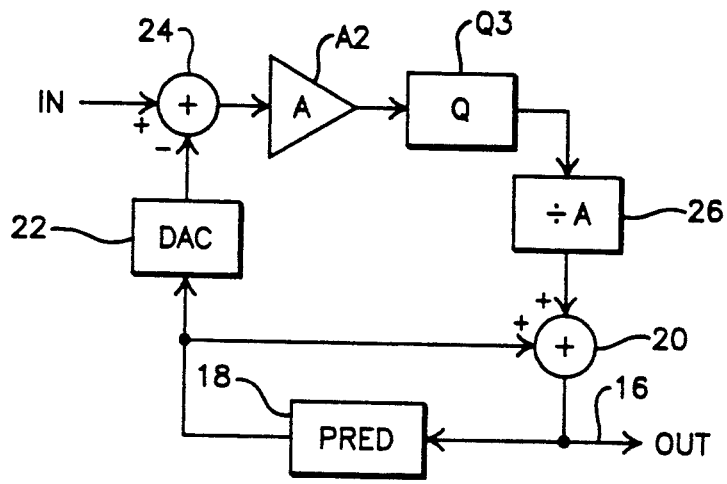
Figure 3:
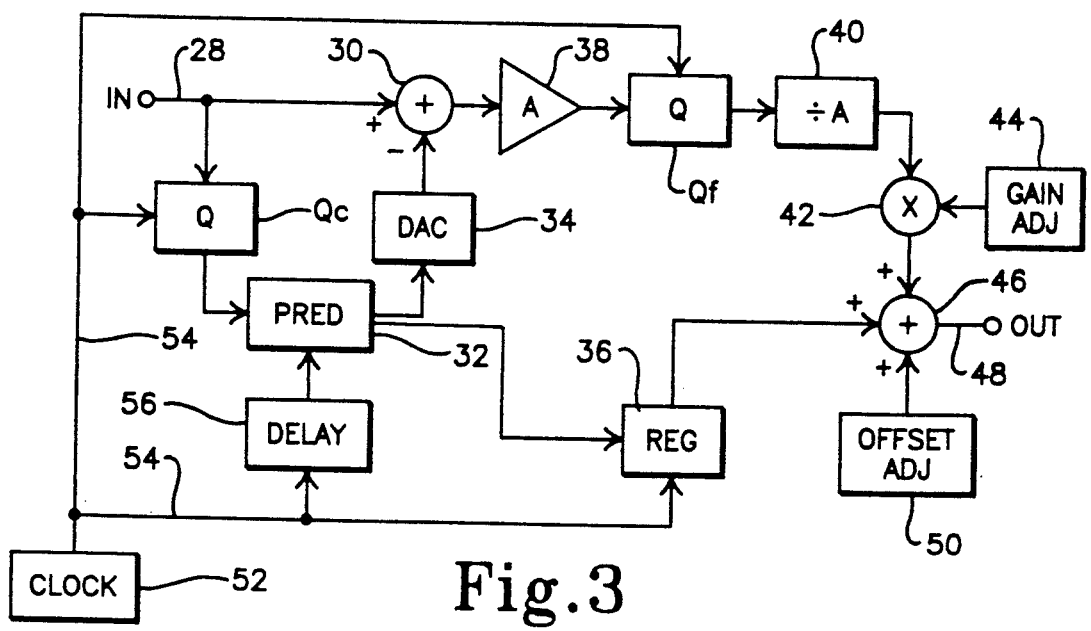
FIG. 3 is a block diagram of an ADC circuit in accordance with the invention.

A block diagram of a fully feed forward, extended dynamic range linear predictive ADC implemented in accordance with the invention is shown in FIG. 3. An input analog signal on input line 28 is supplied to both a course analog-to-digital quantizer Qc and to a summing junction 30. Numerous different designs can be used for the quantizer Qc, including an overall ADC such as that shown in FIG. 3. The primary criteria are that the quantizer have an appropriate number of bits for the desired degree of precision, and that the amount of delay it imparts to a signal being converted to digital format be within an acceptable range; both of these factors are discussed below.

The digitized output of quantizer Qc is supplied to a predictor circuit 32 that, based upon the values of the several most recent samples acquired by the digitizer, predicts the value of the next sample. Numerous different types of digital linear predictors can be used for this purpose, but the device is most easily implemented with a transversal design. The theory and design techniques for the coefficients of the transversal type predictor are well known, and vary with the input signal conditions. An example can be found in the McKnight article, supra, for a given oversample rate, number of taps, input signal frequency and predictor input data quantization levels. The PDSP 16256 programmable FIR (finite impulse response) filter by GEC Plessey Company, which includes up to 128 taps and a maximum data rate of approximately 3 MHz, is a suitable device for the predictor function. The Texas Instruments Corp. TMS 320 DSP (digital signal processor), which can be programmed to perform a predictive function, is another suitable choice.

The output of the predictor 32 is supplied to both a DAC 34 and to a clocked digital delay register 36. The DAC should be non-clocked and have minimal delay. One of several types that can be used is the PMI DAC 312 by Analog Devices, Inc. The register 36 can be of any digital delay architecture, but is most efficiently implemented with a bank of master-slave flip-flops; the bank size depends upon the received wordsize from the predictor 32.

The analog output of the DAC 34 is subtracted from the analog input signal in summing junction 30, and the difference is supplied to an amplifier 38 that multiplies this received signal by an amplification factor A. The amplifier topology depends upon whether the signals that are input and output are in the current or voltage mode. The functions of summing junction 30 and amplifier 38 can be combined in a single differential amplifier. The amplified analog signal is then converted to a digital format by a fine quantizer Qf, which can be identical to the course quantizer Qc. The Sony Corporation 8-bit flash converter is suitable for both quantizers.

The digital output from quantizer Qf is divided by a factor A in a digital divider circuit 40. While numerous different divider circuits can be used, the divider 40 is most efficiently implemented as a simple bit shift hardwired device if the amplifier 38 is a power-of-two device, i.e. $A=2^k$, where k is an integer. However, the invention is not limited to amplifier 38 being a power-of-two device.

A digital gain adjustment multiplier 42 is supplied to adjust the output of digital divider 40 to account for mismatches between amplifier 38 and divider 40. Although these latter devices respectively multiply and divide by the same factor A, the amplifier 38 is an analog device and therefore will have an error, whereas divider 40 is digital and can be made error free. A gain adjustment device 44, described below, provides an appropriate adjustment factor to the multiplier 42.

An output digital summing junction 46 receives and adds together the digital outputs from register 36 and multiplier 42, producing a circuit output on output line 48. An offset adjustment mechanism 50, also discussed below in connection with gain adjustment device 44, provides an additional input to summing junction 46 to compensate for offsets that may be introduced by either the DAC 34, the amplifier 38 or the quantizer Qf.

A clock 52 coordinates the operation of the various circuit components. It produces periodic clocking signals to the two quantizers Qc and Qf, the predictor 32 and the digital register 36; a typical clock period is 156 ns. Although not essential for the invention, a common clock signal is most conveniently provided to the two quantizers Qc and Qf and the register 36 over first clock output lines 54, and a delayed clock signal is provided to the predictor 32 through a delay circuit 56 that is tapped from line 54.

In operation, an analog signal which is lowpass band limited to some nominal bandwidth by a filter, with the band limitation related to the particular design, is input to the ADC along line 28, and is fed into both the coarse quantizer Qc and the analog summing junction 30. The quantizer Qc is clocked at time $t_1$ at a sampling frequency equal to $1/T$, where T is the period between successive samples. Following a data invalid interval $t_a$ during which the quantizer Qc settles to a digital output that corresponds to the clocked input analog signal, with $t_a$ being substantially shorter that T, the resulting digital word is clocked into the predictor 32. There it is used along with some number of past samples to generate a prediction of the analog input signal value that will appear at Qc when the next successive clock pulse arrives at $t_2 = t_1 + T$.

The predicted signal value is truncated to some wordsize of N bits, and is directed to both the DAC 34 and to the digital register 36. The DAC 34 converts the predicted signal into an analog voltage or current, depending upon system design choices, and the result is compared with and subtracted from the analog input signal at summing junction 30 to produce an error signal; the error signal is equal to the difference between the actual value of the analog input signal, and its predicted value as generated by predictor 32 and converted to analog format by DAC 34. This error signal is then amplified by amplifier 38.

The output of DAC 34 is a "held" signal, meaning that it holds a constant value, for an approximate time duration T, which corresponds to the value of the input analog signal at the time quantizer Qc was previously clocked. This is in contrast to the input signal applied to summing junction 30, which is band limited but nevertheless varies as an analog signal. The difference signal at the input to quantizer Qf is thus an analog signal that varies continuously with the analog input signal. The system is designed so the total propagation delay and settling times through the predictor 32, DAC 34 and summing amplifier 38 is less than $T-t_a$. The fine quantizer Qf thus samples at time $t_2 = t_1 + T$ on an accurate version of the difference between the input analog signal and the predicted value of that signal.

After a data invalid settling interval of $t_a$, the sample from fine quantizer Qf is fed into the digital divider 40, which removes the effective gain A of the amplifier by dividing by A, and thereby restores the error signal to a quantized version at its actual size. After a small (relative to T) propagation delay through the divider 40 and a gain adjustment in signal multiplier 42, the error signal is applied to the output summing junction 46.

Returning to the digital register 36, a clock signal is applied to this device before the signal reaches the predictor 32 through the delay circuit 56. Since the register 36 takes only on the order of 1/10 the time to acquire its input signal as is required by the predictor 32 to produce a new output prediction signal after it has been clocked, and also because of the delay in clocking the predictor, the register will acquire the value of the predicted signal as of the time immediately preceding clocking of the predictor. Thus, the register will apply a predicted signal value to the output summing junction 46 at the same time the error signal that corresponds to the actual value of the predicted signal is being applied to the summing junction 46 from the gain adjustment multiplier 42. Through this coordination of operating sequences, the predicted value of an input signal from register 36, together with the error signal associated with the same input signal from gain adjustment multiplier 42, will be applied to the output summing junction 46 for a substantial period of overlap during each clock cycle T.

The selection of the amplify-divide factor A will now be discussed. For any predictor circuit 32, a maximum anticipated error signal can be determined that corresponds to the bandwidth of the input analog signal and the sampling rate (1/T). The course quantizer Qc is preferably selected so that the magnitude of this anticipated error corresponds to its least significant bit. The error signal is then expanded by amplifier 38 to take advantage of substantially the full bit capacity of the fine quantizer Qf, and then restored to its original magnitude by divider 40. Without this expansion and subsequent contraction, a much greater quantization error would be expected from Qf.

Since the error signal furnished to amplifier 38 is analog and can potentially grow to a relatively large value before the signal from DAC 34 is updated there is a danger of saturating the amplifier. The amplifier is accordingly preferably implemented as a gain switching amplifier whose gain is either reduced or cancelled entirely during the periods when the fine quantizer Qf is not actively acquiring the amplified analog signal. Several different gain switching amplifiers are known, and their designs per se are not part of the present invention. The gain switching amplifier would be set to its full amplification value of A for a period of time that extends from just prior to the clocking of the fine quantizer Qf, through the time interval necessary for quantizer Qf to acquire the amplified signal; this period can vary depending upon the type of quantizer used, and a separate clock signal can be used to control the cycling of the amplifier. In this manner saturating the amplifer 38 and overdriving the fine quantizer Qf are avoided.

Where N is the bit precision of Qf and A is the desired summing amplifier gain, the effective dynamic range of the error signal at the output of digital divider 40 is $N + \log_2 A$. Assuming this precision is maintained through the gain adjustment multiplier 42 and output summing amplifier 46, the circuit output over output line 48 will also have a precision corresponding to $N + \log_2 A$ bits. To maintain this degree of output precision, the DAC 34 also has to be linear up to $N + \log_2 A$ bits, or it will introduce distortion.

The gain adjustment mechanism 44 is implemented with an appropriate calibration algorithm or other technique to determine the gain adjustment factor, which may be calculated either previously or on-line and stored outside of the ADC, with an input to the ADC allocated for this purpose. The appropriate adjustment factor can be determined by running a digitized linear ramp signal to the DAC 34, observing the output signal from divider 40 and performing a least squares fit routine to determine the slope of the resulting output signal ramp; any deviation of this slope from unity reflects the mismatch error that is corrected by the gain adjustment mechanism 44. If the output ramp intercepts the y-axis at a location offset from the origin, the offset adjustment mechanism 50 can be programmed to compensate for this offset. The gain adjustment signal should be accurate to at least $N + \log_2 A$ bits.

Figure 4:
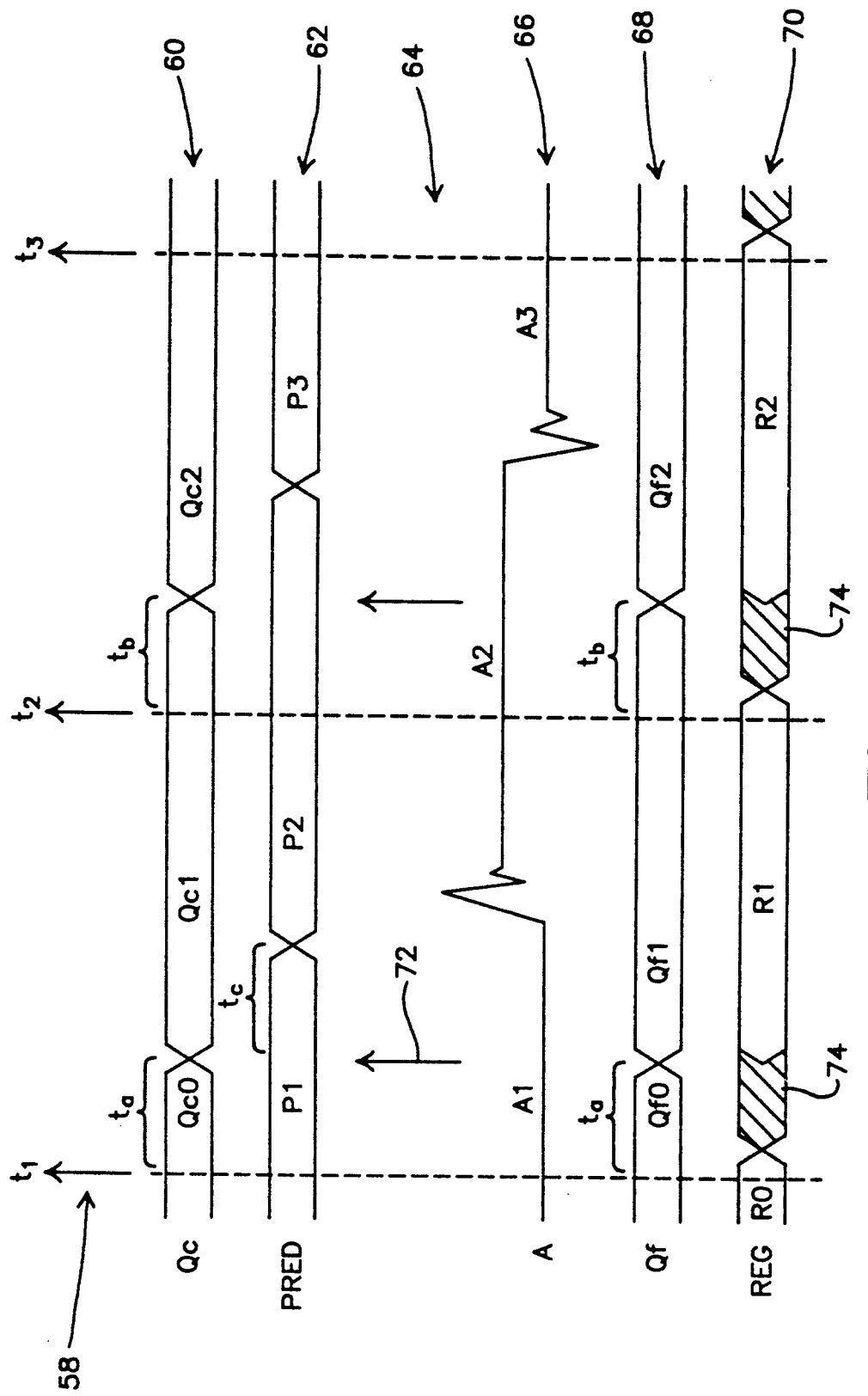
FIG. 4 is a timing diagram for the circuit of FIG. 3.

The preferred sequence of operation is illustrated in the timing diagram of FIG. 4. In this diagram the arrows 58 represent the periodic clock signals along line 54 to quantizers Qc and Qf, trace 60 represents the output of quantizer Qc, trace 62 represents the output of predictor circuit 32, arrows 64 represent the delayed clock signals for the predictor 32, trace 66 represents the outputs of DAC 34 and amplifier 38 (the amplifier is assumed to have negligible processing time), trace 68 represents the output of quantizer Qf, and trace 70 represents the output of digital register 36.

The initial clock pulse to the quantizers is assumed to occur at time $t_1$. At the time this clock signal is received, the quantizer Qc is outputting a digital value of Qc0, corresponding to the input signal value at the time of the immediately preceding clock signal. Upon receiving the clock signal at time $t_1$, Qc acquires the value of the input analog signal on line 28 at that moment and, after a data invalid interval $t_a$, outputs a new digital value Qc1 which is equal to the digitized value of the input analog signal at time $t_1$. Shortly after the end of the data invalid interval for Qc, a delayed predictor clock signal 72 is generated and applied to the predictor 32. At the time this clock signal is received, the predictor is outputting the signal P1 that corresponds to its predicted value of the analog input signal at time $t_1$. Following a propagation delay and settling time $t_c$, the predictor outputs a new digital value P2; this value is based upon Qc1 and the preceding outputs of Qc, and predicts the value of the subsequent input analog signal sample.

Proceeding through the DAC 34 and summing junction 30, the output of amplifier 38 transitions from a first analog regime (A1) based upon the predicted value P1 to a new analog regime (A2) based upon the predicted signal value P2 (after a settling delay). Although horizontal lines are used for A1 and A2 in FIG. 4 for simplicity, in reality the amplifier output is a time-varying analog signal that tracks the input signal.

The signal produced by quantizer Qf, however, although receiving the new error signal based upon predicted value P2, does not immediately respond to that signal. This is because Qf acquired its input analog signal value at time $t_1$, simultaneously with the clocking of Qc. Following the data invalid interval $t_a$, the output of Qf switches from a value (Qf0) based upon the preceding error signal to a new value (Qf1) based upon error signal A1; this quantized error signal Qf1 is held until the next quantizer clock signal $t_2$ is generated. Thus, the quantized error signal Qf1 is presented to output summing junction 46 (following amplification and gain adjustment, which are assumed to require negligible time periods) for an interval that extends from $t_1 + t_a$ through $t_2 + t_b$.

Referring now to the register 36 (trace 70), this element responds to the clock signal at $t_1$ by acquiring the signal existing at the output of the predictor 32 at time $t_1$. However, since the predictor clock signal is delayed and in any event the register operates much more quickly than the predictor, the register acquires the predictor output signal P1 before the predictor changes to its new output level P2. Thus, after a short interval following the clock signal at $t_1$, the register will hold a new signal R1 that corresponds to the predicted analog input signal (P1) at time $t_1$, and this value of R1 is held for the full clock interval T. As can be seen from inspecting traces 68 and 70, there is thus a substantial overlap between the two inputs Qf1 and R1 to the output summing junction; these signals respectively represent the error signal associated with, and the predicted value of, the input analog signal at time $t_1$. An output signal can be acquired from the circuit at any time during this period of overlap; the relatively short intervals during which the output signal on line 48 is invalid is represented by hatched areas 74 in FIG. 4.

The output of the described circuit is normally registered and then passed on for further signal processing. The receiving register which accepts the output from line 48 is outside of the ADC, and is not shown in FIG. 3. However, it can be periodically clocked so that the output signals are acquired at any desired time within the valid period of overlap between the signals presented to output summing junction 46.

A fully feed forward, extended dynamic range linear predictive ADC has thus been shown and described that eliminates both the instability of prior predictive circuits, and the sample-and-hold circuits required with prior multipass sub-ranging ADCs. As numerous variations and alternate embodiments will occur to those skilled in the art, it is intended that the invention be limited only in terms of the appended claims.

We claim:

1. A feed-forward analog-to-digital converter (ADC), comprising:
    means responsive to an input analog signal for producing digital and analog signals representing a predicted subsequent value of said input analog signal,
    means for producing a digital error signal that represents the difference between the value of said analog predicted signal and the actual subsequent value of said input analog signal, and
    means for feeding forward said digital predicted signal and combining it with said digital error signal to produce a digital output signal that corresponds to said analog input signal.

2. A feed-forward analog-to-digital converter (ADC), comprising:
    means responsive to an input analog signal for producing digital and analog signals representing a predicted subsequent value of said input analog signal,
    means for producing a digital error signal that represents the difference between the value of said analog predicted signal and the actual subsequent value of said input analog signal, and means for feeding forward said digital predicted signal and combining it with said digital error signal to produce a digital output signal that corresponds to said analog input signal, said means for producing said digital and analog predicted signals comprising a first quantizer connected to periodically quantize said input analog signal to a digital format, a signal predictor means responsive to the digital output from said first quantizer to produce said digital predicted signal, and a digital-to-analog converter (DAC) responsive to said digital predicted signal to produce said analog predicted signal.

3. The feed-forward ADC of claim 2, said means for producing a digital error signal comprising means for comparing the actual subsequent value of said input analog signal with said analog signal representing the predicted subsequent value of said input analog signal to obtain an analog error signal that represents the difference between the compared signals, and a second quantizer connected to quantize said analog error signal.

4. The feed-forward ADC of claim 3, further comprising a timing control means controlling the operation of said first and second quantizers and of said predictor means so that the predicted subsequent value of said input analog signal is presented to said comparing means in analog format in a time period that overlaps the time at which the actual subsequent value of said input analog signal is presented to said comparing means, and the quantized error signal for said input analog signal together with said digital predicted signal are presented to said combining means during substantially overlapping time periods.

5. The feed-forward ADC of claim 3, further comprising means for amplifying said analog error signal prior to quantization by said second quantizer, and means for de-amplifying the digital output from said second quantizer by an amount that compensates for said amplification.

6. The feed-forward ADC of claim 5, wherein said error signal has an anticipated range of values relative to said input signal, said amplifying means amplifying said analog error signal so that the maximum anticipated error signal occupies substantially the full bit capacity of said second quantizer.

7. The feed-forward ADC of claim 5, said amplifying means comprising a gain switching amplifier, and further comprising a timing control means for setting the amplifier gain at a higher value when said second quantizer is actively acquiring said analog error signal than at other times.

8. The feed-forward ADC of claim 5, further comprising means for adjusting the output of said de-amplifying means to compensate for mismatches between said amplifying means and said de-amplifying means.

9. The feed-forward ADC of claim 3, further comprising means for supplying an offset adjustment signal to said signal combining means to compensate for offsets in said quantized error signal.

10. A feed-forward analog-to-digital converter (ADC), comprising:
means responsive to an input analog signal for producing digital and analog signals representing a predicted subsequent value of said input analog signal,
means for producing a digital error signal that represents the difference between the value of said analog predicted signal and the actual subsequent value of said input analog signal, and
means for feeding forward said digital predicted signal and combining it with said digital error signal to produce a digital output signal that corresponds to said analog input signal,
further comprising a digital signal storage means interfacing between said predictor means and said combining means for storing the digital output of said predictor means and presenting said stored digital output to said combining means, and means for updating the signal stored in said digital storage means prior to the digital output from said predictor means being updated.

11. An analog-to-digital converter (ADC), comprising:
a first quantizer connected to receive an input analog signal and to periodically quantize said input signal to a digital format,
signal predictor means responsive to the digital output from said first quantizer to produce a digital output that corresponds to a predicted subsequent value of said input analog signal,
digital-to-analog converter (DAC) means for converting said predictor means output to an analog format,
means for comparing said analog predictor means output with the actual subsequent value of said input analog signal to obtain an analog error signal that represents the difference between said actual and predicted values,
a second quantizer connected to quantize said analog error signal to a digital format, and
means for combining the digital output from said signal predictor means with said quantized error signal to obtain a digital output signal that corresponds to said analog input signal.

12. The ADC of claim 11, further comprising means for amplifying said analog error signal prior to quantization by said second quantizer, and means for de-amplifying the digital output from said second quantizer by an amount that compensates for said amplification.

13. The ADC of claim 12, wherein said error signal has an anticipated range of values relative to said input signal, said amplifying means amplifying said analog error signal so that the maximum anticipated error signal occupies substantially the full bit capacity of said second quantizer.

14. The ADC of claim 13, said first and second quantizers having respective multi-bit capacities, wherein said maximum anticipated error signal is within the least significant bit of said first quantizer.

15. The ADC of claim 12, further comprising means for adjusting the output of said de-amplifying means to compensate for mismatches between said amplifying means and said de-amplifying means.

16. The ADC of claim 11, further comprising a timing control means controlling the operation of said first quantizer and said predictor means so that the predicted subsequent value of said input analog signal is presented to said comparing means in analog format in a time period that overlaps the time at which the actual subsequent value of said input analog signal is presented to said comparing means.

17. The ADC of claim 16, wherein said timing control means also controls the operation of said second quantizer so that the quantized error signal for said subsequent input analog signal together with the digital output from said signal predictor means corresponding to said subsequent input analog signal, are presented to said combining means during substantially overlapping time periods.

18. The ADC of claim 17, wherein said timing control means clocks said first and second quantizers substantially simultaneously.

19. The ADC of claim 11, further comprising a digital signal storage means interfacing between said predictor means and said combining means for storing the output of said predictor means and presenting said stored output to said combining means, and means for updating the signal stored in said digital storage means prior to the digital output from said predictor means being updated.

20. The ADC of claim 11, further comprising means for supplying an offset adjustment signal to said signal combining means to compensate for offsets in said quantized error signal.

21. In an analog-to-digital converter (ADC) having means for producing an analog error signal that represents the difference between an input analog signal and a base analog signal value that is derived from a digitized representation of said input analog signal, means for amplifying said analog error signal, means for quantizing the amplified analog error signal, means for de-amplifying the quantized amplified error signal to compensate for said amplification, and means for combining said de-amplified quantized error signal with said digitized representation to obtain an output digital signal, the improvement comprising:
  means for adjusting the output of said de-amplifying means to compensate for mismatches between said amplifying means and said de-amplifying means.

22. The ADC of claim 21, further comprising means for supplying an offset adjustment signal to said signal combining means to compensate for offsets in said quantized error signal.

23. The ADC of claim 21, wherein said digitized representation of said input analog signal comprises a predicted value of said input analog signal based upon past values of said input analog signal.

24. In an analog-to-digital converter (ADC) having means for producing an analog error signal that represents the difference between an input analog signal and a base analog signal value that is derived from a digitized representation of said input analog signal, means for amplifying said analog error signal, means for quantizing the amplified analog error signal, means for de-amplifying the quantized amplified error signal to compensate for said amplification, and means for combining said de-amplified quantized error signal with said digitized representation to obtain an output digital signal, the improvement comprising:
  means for supplying an offset adjustment signal to said signal combining means to compensate for offsets in said quantized error signal.

25. The ADC of claim 24, wherein said digitized representation of said input analog signal comprises a predicted value of said input analog signal based upon past values of said input analog signal.

26. An analog-to-digital converter (ADC) comprising:
  an input for receiving an analog input signal;
  feed forward predictor means responsive to said input analog signal for producing a digital predicted signal and a predicted analog signal, said signals representing a predicted subsequent value of said input analog signal,
  error signal means, coupled to said predictor means and said input, for producing a digital error signal that represents the difference between the value of said predicted analog signal and the actual subsequent value of said input analog signal, and
  feed forward means, coupled to said error signal means and said predictor means, for feeding forward said digital predicted signal and combining it with said digital error signal to produce a digital output signal that corresponds to said analog input signal.

* * * * *